(12) United States Patent
Zhao et al.

(10) Patent No.: US 12,538,456 B2
(45) Date of Patent: Jan. 27, 2026

(54) HEAT DISSIPATION DEVICE FOR AN UNDERWATER EQUIPMENT

(71) Applicant: HMN Technologies Co., Limited, Tianjin (CN)

(72) Inventors: Ling Zhao, Tianjin (CN); Jianping Li, Tianjin (CN); Jing Ning, Tianjin (CN); Daofang Zhong, Tianjin (CN)

(73) Assignee: HMN Technologies Co., Limited, Tianjin (CN)

( * ) Notice: Subject to any disclaimer, the term of this patent is extended or adjusted under 35 U.S.C. 154(b) by 255 days.

(21) Appl. No.: 18/432,311

(22) Filed: Feb. 5, 2024

(65) Prior Publication Data
US 2025/0176142 A1  May 29, 2025

(30) Foreign Application Priority Data
Nov. 23, 2023  (CN) .......................... 202311566507.9

(51) Int. Cl.
*H05K 7/20* (2006.01)

(52) U.S. Cl.
CPC ................. *H05K 7/2039* (2013.01)

(58) Field of Classification Search
CPC .................................................. H05K 7/2039
See application file for complete search history.

(56) References Cited

U.S. PATENT DOCUMENTS

| 9,844,167 B2 * | 12/2017 | Peterson | .............. H05K 7/2079 |
| 10,209,453 B1 | 2/2019 | Hsia et al. | |
| 2010/0254087 A1 * | 10/2010 | Godfroy | .................. H05K 5/06 361/699 |
| 2013/0032314 A1 * | 2/2013 | Baerd | ................ H05K 7/20272 165/104.33 |
| 2024/0121917 A1 * | 4/2024 | Han | ................... H05K 7/20709 |

FOREIGN PATENT DOCUMENTS

| CN | 209745955 U | 12/2019 |
| CN | 211144910 U | 7/2020 |
| CN | 113347856 A | 9/2021 |
| CN | 215268584 U | 12/2021 |
| CN | 217362402 U | 9/2022 |
| CN | 115315152 A | 11/2022 |
| JP | 2023025984 A | 2/2023 |
| KR | 20160004761 A | 1/2016 |
| WO | WO2023010836 A1 | 2/2023 |

* cited by examiner

*Primary Examiner* — Mukundbhai G Patel
(74) *Attorney, Agent, or Firm* — Laine IP Oy

(57) ABSTRACT

A heat dissipation device for an underwater equipment is provided. The heat dissipation device includes a heat dissipation shell coaxially arranged around outside of the underwater equipment and a water permeating component. The heat dissipation shell includes a cylindrical shell body. The water permeating component has a conical structure and is provided with multiple first water inlets, and is arranged at two ends of the heat dissipation shell and is connected with the shell body to form a heat dissipation chamber together with the shell body and the housing of the underwater equipment. Through the above structure, heat generated by the underwater equipment can be dissipated through the liquid in the heat dissipation chamber and the heat dissipation shell after the underwater equipment is buried, and thus the heat dissipation efficiency for the underwater equipment buried under the silt in the shallow water area can be improved.

11 Claims, 3 Drawing Sheets

HEAT DISSIPATION DEVICE FOR AN UNDERWATER EQUIPMENT

CROSS-REFERENCE TO RELATED APPLICATION

This application claims priority to Chinese Patent Application No. 202311566507.9, filed on Nov. 23, 2023, which is incorporated herein by reference in its entirety.

FIELD OF THE INVENTION

The present application relates to the technical field of heat dissipation, in particular to a heat dissipation device for an underwater equipment.

BACKGROUND OF THE INVENTION

In the process of realizing long-distance communication of the underwater communication system, photoelectric cables and the underwater equipment may be laid in different ways in different areas due to the underwater terrains in different areas. For example, photoelectric cables and underwater equipment generally need to be buried 3 meters below the seabed in shallow water areas so as to reduce impacts of human activities and environmental organisms on the cables and the equipment, while the photoelectric cables and underwater equipment may be directly laid on the surface of the seabed in deep water areas because there are fewer human activities and environmental organisms in the deep water areas.

Due to the precision and designed life of the underwater communication system, underwater equipment has strict requirements on the operating temperature, and the operating temperature is generally ranged 0~35° C. The water temperature in the deep water area is generally about 4° C., and the operating temperature of the underwater equipment may be reduced through the seawater even if heat is generated during the operation of the underwater equipment.

However, in the shallow water area, the underwater equipment is buried in silt, and heat dissipation efficiency of the underwater equipment may be reduced due to wrapping of the silt. In addition, the sea surface temperature will change with the season, and the heat dissipation efficiency of the underwater equipment would be further reduced if the sea water temperature is high, thereby affecting normal operation of the underwater equipment.

SUMMARY OF THE INVENTION

The present application provides a heat dissipation device for an underwater equipment, to solve the problem that the normal operation of the underwater equipment of the underwater communication system in shallow water areas is affected due to the low heat dissipation efficiency for the underwater equipment.

According to some embodiments of the present application, a heat dissipation device for an underwater equipment is provided, which is applied to the underwater equipment of an underwater communication system. The heat dissipation device includes a heat dissipation shell and a water permeating component. The heat dissipation shell is arranged around an outside of the underwater equipment, and the heat dissipation shell includes an shell body in a cylindrical structure, with a diameter of a cross section of the shell body being greater than a diameter of a cross section of a housing of the underwater equipment. The shell body and the underwater equipment are coaxially arranged. The water permeating component is in a conical structure and is provided with a plurality of first water inlets arranged in an array, and is arranged at two ends of the heat dissipation shell and is connected with the shell body to enclose and form a heat dissipation chamber together with the shell body and the housing of the underwater equipment.

In this way, by providing a heat dissipation shell and a water permeating component around the underwater equipment, liquid can be filled into the heat dissipation shell during construction of the underwater equipment, and with coordination of the liquid and the shell, the heat dissipation area of the underwater equipment is increased, and the heat conduction efficiency is improved, which in turn improves the heat dissipation efficiency of the underwater equipment and improves the operational stability of the underwater communication system.

In an implementation, the heat dissipation shell further includes a fixing support arranged between the housing of the underwater equipment and the shell body and is configured to support the heat dissipation chamber. In this way, the fixing support can support the heat dissipation chamber and improve the structural strength of the heat dissipation shell, so as to avoid reduced heat dissipation efficiency due to structural deformation.

In an implementation, the fixing support includes at least one annular sheet including a cylindrical inner surface and a cylindrical outer surface. The annular sheet is coaxial with the shell body, with the cylindrical inner surface abutting against the housing of the underwater equipment and the cylindrical outer surface abutting against the shell body. In this way, by providing the annular sheet between the housing of the underwater equipment and the shell body to support the heat dissipation chamber formed by the heat dissipation shell and the water permeating component, a risk of structural deformation is reduced.

In an implementation, the fixing support includes three annular sheets arranged in an array between the housing of the underwater equipment and the shell body. In this way, the heat dissipation shell is supported by providing multiple annular sheets, which further reduces the risk of structural deformation due to pressure.

In an implementation, the annular sheet is provided thereon with a plurality of water permeating holes arranged in an array, and a diameter of the water permeating hole is less than or equal to an aperture of the first water inlet. In this way, although the heat dissipation chamber is divided into multiple sub-chambers by the annular sheets, liquid can flow through the water permeation holes, and then the heat dissipation efficiency of the heat dissipation device for the underwater equipment is increased.

In an implementation, the annular sheet is provided with a friction piece, and the friction piece is arranged between the cylindrical inner surface and the housing of the underwater equipment so as to increase friction between the annular sheet and the underwater equipment. The friction piece is provided so as to increase the friction between the annular sheet and the underwater equipment, thereby preventing the heat dissipation shell from sliding or falling off.

In an implementation, the shell body is provided thereon with a fixing groove, and the fixing groove is in an interference fit with the annular sheet to arrange the annular sheet on the shell body. In this way, the annular sheet can be fixed by matching with the shell body, to increase the fixed strength of the annular sheet and thus improve the structural strength of the heat dissipation device for the underwater equipment.

In an implementation, the fixing support includes a plurality of support pillars arranged in an array, with a pore existing between two adjacent support pillars; one end of the support pillar is fitted with the shell body and the other end of the support pillar is in contact with the housing of the underwater equipment. In this way, the heat dissipation chamber is supported by multiple support pillars, thereby reducing the risk of structural deformation.

In an implementation, the heat dissipation shell and the water permeating component are made of metal. The heat dissipation shell and water permeating component made of metal can increase the structural strength of the heat dissipation device for the underwater equipment. In addition, the metal has a high thermal conductivity, which improves the heat dissipation efficiency for the underwater equipment.

In an implementation, the heat dissipation shell is provided with a plurality of second water inlets arranged in an array, and an aperture of the second water inlet is less than or equal to an aperture of the first water inlet. By setting the second water inlets on the heat dissipation shell, the water filling rate of the heat dissipation chamber is increased, which avoids insufficient water filling in the heat dissipation chamber.

In an implementation, the aperture of the first water inlet is less than 5 mm and greater than 1 mm. In this way, it can prevent large amounts of silt from entering the heat dissipation chamber during construction of the underwater equipment, and thus improves the heat dissipation efficiency for the underwater equipment.

From the above solutions, it is seen that a heat dissipation device for an underwater equipment is provided according to this application, which is applied to the underwater equipment of an underwater communication system. The heat dissipation device includes a heat dissipation shell and a water permeating component. The heat dissipation shell is arranged around an outside of the underwater equipment, and includes a shell body in a cylindrical structure, with a diameter of a cross section of the shell body being greater than a diameter of a cross section of a housing of the underwater equipment. The shell body and the underwater equipment are coaxially arranged. The water permeating component is in a conical structure and is provided with a plurality of first water inlets arranged in an array. The water permeating component is arranged at two ends of the heat dissipation shell and is connected with the shell body to enclose and form a heat dissipation chamber together with the shell body and the housing of the underwater equipment. With the above structures, heat generated by the underwater equipment can be dissipated through the liquid in the heat dissipation chamber and the heat dissipation shell after the underwater equipment is buried, and thus the heat dissipation efficiency for the underwater equipment buried under the silt in the shallow water area can be improved.

BRIEF DESCRIPTION OF THE DRAWINGS

In order to illustrate the technical solutions of the present application in details, a brief description of the drawings used for the embodiments is given below. It is apparent that other drawings can be obtained by those skilled in the art based on these drawings without making creative efforts.

DESCRIPTION FOR THE DRAWINGS

100—heat dissipation shell; 200—water permeating component; 110—shell body; 111—second water inlet; 120—heat dissipation chamber; 130—fixing support; 131—annular sheet; 131a—first annular sheet; 131b—second annular sheet; 131c—third annular sheet; 1311—water permeating hole; 1312—friction piece; 132—support pillar; 1321—water permeating hole; 140—fixing groove; 201—first water inlet.

DETAILED DESCRIPTION OF THE EMBODIMENTS

The technical solutions of the present application will be described in combination with embodiments below in details. Obviously, the embodiments described herein are only part, but not all, of embodiments of the present application. All other embodiments obtained by those skilled in the art based on the embodiments of the present application without creative labor fall within the scope of protection of the present application.

The terms "first" and "second" are used for descriptive purposes only and are not to be understood as indicating or implying importance or implicitly indicating the quantity of technical features indicated. Thus, a feature with the "first" or "second" may explicitly or implicitly include one or more said features. In the description of the present application, "multiple" or "a plurality of" means two or more, unless otherwise expressly specified. In addition, the terms "installation" and "connection" should be understood in a broad sense, for example, it may be fixed connection, detachable connection or integrated connection; it may be a mechanical connection or an electrical connection; it may be direct connection or indirect connection through an intermediate medium; or may be connection within two elements. For those skilled in the art, the specific meaning of the above terms in the present application can be understood based on specific context.

The underwater communication system is laid in an environment such as the seabed or the bottom of the lake, to achieve long-distance data communication. For example, the underwater communication system may include a submarine cable communication system.

Figure 1:
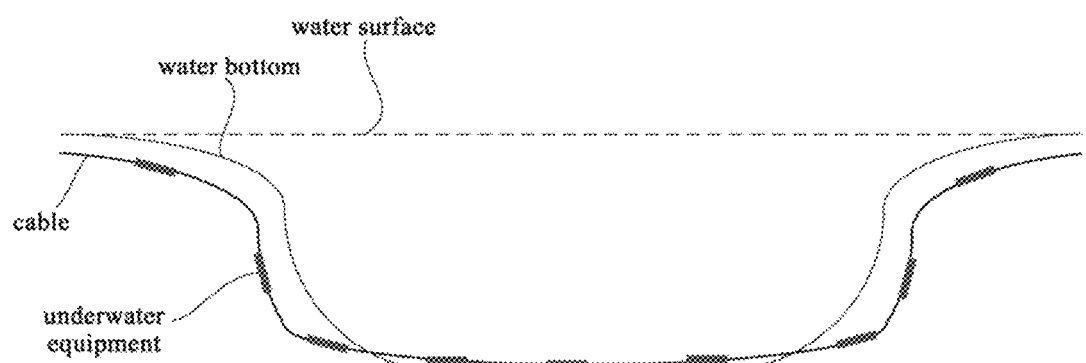
FIG. 1 is a structural schematic diagram of an underwater communication system.

However, in the process of realizing long-distance communication of the underwater communication system, photoelectric cables and the underwater equipment may be laid in different ways in different areas due to the underwater terrains in different areas. As shown in FIG. 1, the photoelectric cables and underwater equipment need to be buried 3 meters below the seabed in shallow water areas so as to reduce impacts of human activities and environmental organisms on the cables and equipment, while the photoelectric cables and underwater equipment may be directly laid on the surface of the seabed in deep water areas because there are fewer human activities and environmental organisms in the deep water areas.

Due to the precision and designed life of the underwater communication system, underwater equipment has strict requirements on the operating temperature, and in some embodiments, the operating temperature of the underwater equipment is ranged 0~35° C. The water temperature in the deep water areas is generally about 4° C., and thus even if heat is generated during the operation of the underwater equipment, the heat from the underwater equipment can be dissipated by the seawater, to reduce the operating temperature of the underwater equipment.

However, in the shallow water area, the underwater equipment is buried in silt and the heat dissipation efficiency of the underwater equipment may be reduced due to silt wrapping. In addition, the sea surface temperature will change with the season, and the heat dissipation efficiency of the underwater equipment would be further reduced if the sea water temperature is high, thereby affecting normal operation of the underwater equipment.

Figure 2:
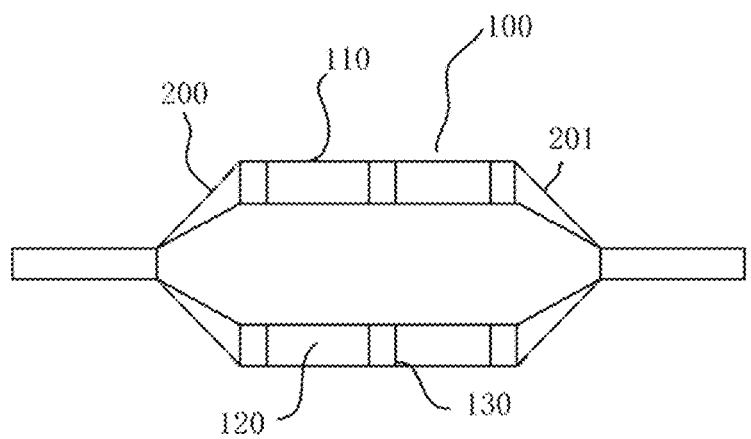
FIG. 2 is a schematic diagram of a sectional structure of a heat dissipation device for an underwater equipment according to some embodiments of the present application.

In order to solve the problem that normal operation of the underwater equipment of the underwater communication system laid in shallow water area is affected due to low heat dissipation efficiency for the underwater equipment, a heat dissipation device for an underwater equipment is provided according to some embodiments of the present application, which is applied to the underwater equipment of the underwater communication system. As shown in FIG. 2, the heat dissipation device includes a heat dissipation shell 100 and a water permeating component 200. The heat dissipation shell 100 is arranged around an outside of the underwater equipment.

The heat dissipation shell 100 includes a shell body 110 in a cylindrical structure. A diameter of a cross section of the shell body 110 is greater than a diameter of a cross section of the underwater equipment surrounded by the heat dissipation shell 100. The shell body 110 and the underwater equipment are coaxially arranged. In this way, the heat generated by the underwater equipment during operation can be dissipated through the heat dissipation shell and the medium in the heat dissipation shell.

It should be noted that the underwater equipment referred to in the embodiments of the present application may be an equipment such as an optical repeater (RPT), and the like. Since signals will be lost in the cable during long-distance communication transmission, RPTs with signal relay and amplification functions are set at intervals in the cable, to achieve long-distance transmission of signals. The cable length between two RPTs may be 50 km, 70 km, or 100 km. The cable length between two RPTs is not limited in the present application. During the establishment of the underwater communication system, the underwater equipment is usually set directly on the cable and coiled with the cable, to be lowered into the water with the cable.

The water permeating component 200 of the heat dissipation device is in a conical structure. The water permeating component 200 is arranged at two ends of the heat dissipation shell 100, such that the water permeating component 200 is connected with the shell body 110, and a heat dissipation chamber 120 is formed by the water permeating component 200, the shell body 110 and the housing of the underwater equipment. In an implementation, the heat dissipation device is provided with two water permeating components 200, which are arranged at two opposite ends of the heat dissipation shell 100, respectively.

In some embodiments of the present application, the two ends of the shell body 110 may be provided with internal threads, and external threads are provided on the water permeating component 200, and the shell body 110 and the water permeating component 200 may be connected through the threads to achieve enclosure of the heat dissipation chamber 120. It should be noted that the above connection manner is only one of the feasible connection manners between the shell body 110 and the water permeating component 200, and this application does not intend to limit the connection manner between the shell body 110 and the water permeating component 200.

Figure 3:
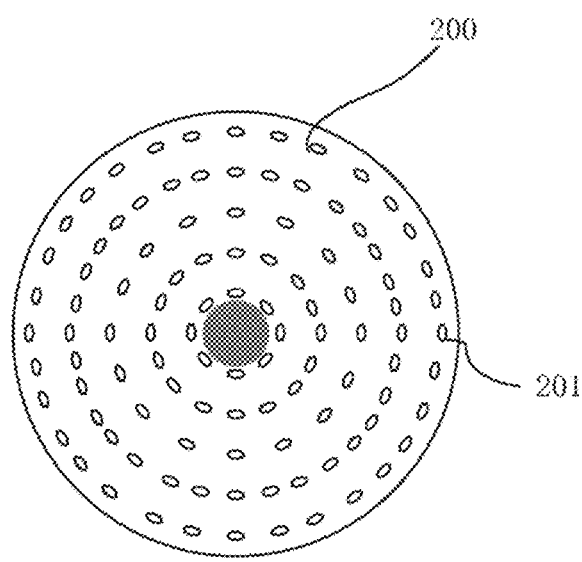
FIG. 3 is a structural schematic diagram of a water permeating component according to some embodiments of the present application.

Meanwhile, in order to realize heat dissipation through water, as shown in FIG. 3, the water permeating component 200 is provided with a plurality of first water inlets 201 arranged in an array. In this way, when the underwater equipment enters into water with the cable, water can enter into the heat dissipation chamber 120 through the first water inlets 201 of the water permeating components 200 located at two ends of the heat dissipation shell 100 under the action of water pressure, such that the heat dissipation chamber 120 is gradually filled with water, and thus, after the underwater equipment is buried in the silt of the seabed, dissipation still can be achieved through the heat dissipation device and the water in the heat dissipation device.

In some embodiments, a diameter of the first water inlet 201 may be less than 5 mm and greater than 1 mm. In this way, it can prevent large amounts of silt from entering the heat dissipation chamber 120 during the process of burying the underwater equipment, and thus improve the heat dissipation efficiency for the underwater equipment. Meanwhile, it also avoids the diameter of the first water inlet 201 being too small. Therefore, water is able to flow into the heat dissipation chamber 120 through the first water inlet 201 during the construction process, avoiding low heat dissipation efficiency due to insufficient liquid in the heat dissipation chamber 120.

According to an exemplary embodiment, a screen mesh with an aperture smaller than the diameter of the first water inlet 201 may be provided in the water permeating component 200, so as to block small particles of silt entering into the heat dissipation chamber and reduce affection of the silt on the heat dissipation efficiency.

It should be noted that the diameter of the first water inlet 201 may be larger or smaller, and the values provided in the present application are only as a practicable implementation. The specific value of the diameter of the first water inlet 201 is not limited in the present application. However, in order to ensure that large particles of silt are blocked and water flows into the heat dissipation chamber in time, the diameter of the first water inlet 201 should be in a millimeter level.

Figure 4:
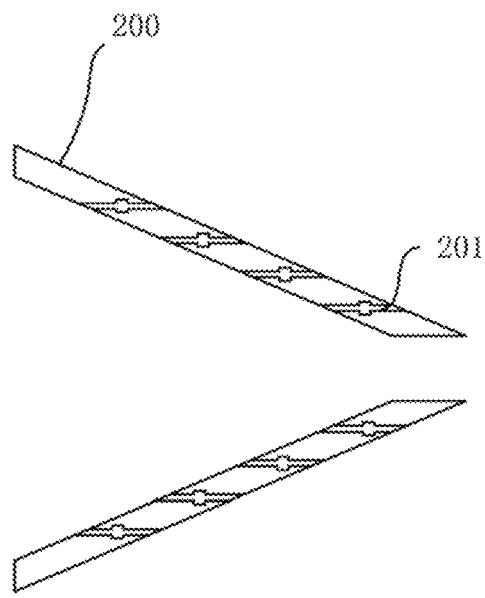
FIG. 4 is a sectional schematic diagram of a water permeating component according to some embodiments of the present application.

In some embodiments of the present application, as shown in FIG. 4, the shell of the water permeating component 200 may have a certain thickness, and the first water inlet 201 may be provided with a groove to retain the silt in the water and reduce the possibility that the silt enters the heat dissipation chamber 120. It should be understood that, since the water permeating component 200 may be rotated during installation and usage, each first water inlet 201 may be provided with grooves arranged in opposite directions of the first water inlet, such that each first water inlet 201 has the function of filtering silt.

It should be noted that, providing grooves in the first water inlet 201 to reduce silt entry is only a feasible implementation. In specific implementations, it is possible to reduce silt entering by designing the shape of the first water inlet 201, such as designing a V-shaped or S-shaped path for the first water inlet 201 so as to reduce silt inflow. The shape of the first water inlet 201 is not limited in the present application.

A heat dissipation effect of the underwater equipment may be expressed as $Q1=K1 \times S1$ in a case that the underwater equipment is not provided with the heat dissipation device, where $Q1$ is a heat dissipation amount before adding the shell, $K1$ is a heat dissipation coefficient before adding the shell, and $S1$ is a heat dissipation area before adding the shell. In the case that the underwater equipment is provided with the heat dissipation device, a heat dissipation effect of the underwater equipment may be expressed as $Q2=K2 \times S2$, where $Q2$ is the heat dissipation amount after providing the shell, $K2$ is the heat dissipation coefficient after providing the shell, and $S2$ is the heat dissipation area after providing the shell.

Since the heat dissipation coefficient of water is greater than the heat dissipation coefficient of the underwater equipment and the heat dissipation coefficient of the silt, and the heat dissipation area of the underwater equipment is increased to be the surface area of the heat dissipation device after the heat dissipation device is arranged around an outside of the underwater equipment, the heat dissipation amount after providing the heat dissipation device is greater than the heat dissipation amount before providing the heat dissipation device under the condition that the underwater equipment generates the same heat, the heat dissipation area of the underwater equipment is increased and the heat conduction efficiency is improved, the heat dissipation efficiency of the underwater equipment during operation is improved, and the operational stability of the underwater communication system is improved.

In some embodiments of the present application, the shell body 110 and the water permeating component 200 are made of metal. Since the metal has a good thermal conductivity, it can assist the water in the heat dissipation chamber 120 to dissipate heat and thus improve the heat dissipation efficiency.

According to an exemplary embodiment, the shell body 110 and the water permeating component 200 may be made of such metal as copper, aluminum or iron. The shell body 110 and the water permeating component 200 made of metal can increase the structural strength of the heat dissipation device for the underwater equipment. In addition, the metal has a high thermal conductivity, which can further improve the heat dissipation efficiency for the underwater equipment.

It should be understood that, since the underwater equipment in the shallow water area needs to be buried under the water bottom, the heat dissipation device needs to be sleeved on the underwater equipment before the cable and the underwater equipment are placed into the water, and then the cable, together with the heat dissipation device and the underwater equipment, are coiled around equipment of the construction vessel, such as the cable-guiding rail and the wheel hub. Therefore, the diameter of the shell body 110 of the heat dissipation shell 100 must meet the restrictions of the cable-guiding rail and the wheel hub, so as to avoid the underwater equipment provided with the heat dissipation device from being away from the cable-guiding rail and the wheel hub or damaging the connected cable, when the underwater equipment is coiled on the cable-guiding rail and the wheel hub.

In the process of constructing the underwater communication system, the underwater equipment needs to be constructed together with the cable, therefore the heat dissipation device arranged around the underwater equipment needs to be placed into water and buried into the seabed together with the underwater equipment. During the construction process, the cable and the underwater equipment will be coiled around the cable-guiding rail and wheel hub of the construction vessel, such that the cable and the underwater equipment can be lowered into the water through rotation of the wheel hub. In addition, when the underwater communication system is constructed in a shallow water area, the cable and the underwater equipment need to be buried in the seabed, with the burying depth being at least 3 m. Therefore the heat dissipation device should have a certain structural strength, to avoid winding and damage to the structure of the heat dissipation device when the burying depth is large, diminishing the occurrence of such problems as deformation of the shell body 110 and reduction of the heat dissipation chamber 120.

In some embodiments, the heat dissipation shell 100 is provided with a fixing support 130. Specifically, the fixing support 130 is arranged between the housing of the underwater equipment and the shell body 110, and the fixing support 130 can provide support for the heat dissipation chamber 120, to improve the structural strength of the heat dissipation shell 100, thereby diminishing deformation of the heat dissipation shell 100 during the construction process, improving the reliability of the device, and avoiding reduced heat dissipation efficiency due to structural deformation.

Figure 5:
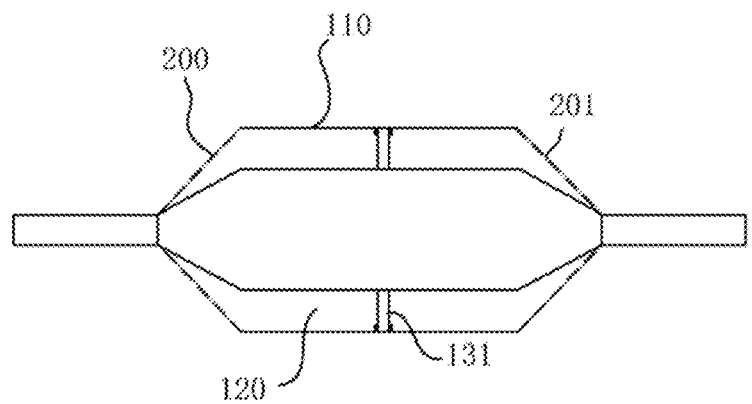
FIG. 5 is a structural schematic diagram of a heat dissipation device for an underwater equipment according to some embodiments of the present application.

In order to support the heat dissipation shell 100, as shown in FIG. 5, the fixing support 130 may include at least one annular sheet 131. It should be understood that the annular sheet 131 is a sheet structure of an annular shape with a certain thickness, and thus the annular sheet 131 has two cylindrical arced surfaces that are coaxial, that is, a cylindrical inner surface and a cylindrical outer surface, and a diameter of a cross section of the cylindrical inner surface is less than a diameter of a cross section of the cylindrical outer surface.

The diameter of the cross section of the cylindrical inner surface is the same as the diameter of the cross section of the housing of the underwater equipment, and the diameter of the cross section of the cylindrical outer surface is the same as the diameter of the cross section of the shell body 110. In an exemplary implementation, the annular sheet 131 shall be arranged coaxially with the underwater equipment and the shell body 110, such that the cylindrical inner surface abuts against the housing of the underwater equipment and the cylindrical outer surface abuts against the shell body 110.

In this way, the heat dissipation chamber 120 formed by the heat dissipation shell 100 and the water permeating component 200 is supported via the annular sheet provided between the underwater equipment and the shell body 110. Therefore, when the shell body 110 is pressed by an external force, the external force can be partially transmitted to the underwater equipment through the annular sheet 131 to reduce the risk of deformation of the overall structure of the heat dissipation device.

In some embodiments of the present application, as shown in FIG. 5, the number of the annular sheets 131 may be one. Specifically, the annular sheet 131 may be arranged at a central position of the heat dissipation chamber 120, that is, spaces at opposite sides of the annular sheet 131 are of the same size, and thus support strength of the shell body 110 is uniform, which thereby improves the structural strength of the heat dissipation device.

Figure 6:
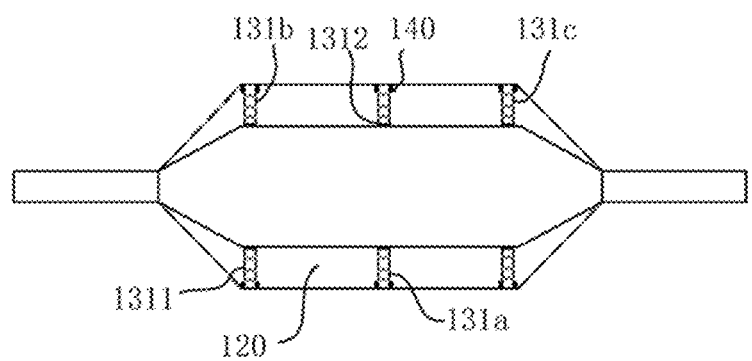
FIG. 6 is a structural schematic diagram of another heat dissipation device for an underwater equipment according to some embodiments of the present application.

In an exemplary implementation, as shown in FIG. 6, the fixing support 130 may include three annular sheets 131 arranged between the underwater equipment and the shell body 110 in an array. Specifically, the first annular sheet 131a is arranged at the central position of the heat dissipation chamber 120, and the second annular sheet 131b and the third annular sheet 131c are respectively arranged at opposite sides of the first annular sheet 131a, with a distance between the first annular sheet 131a and the second annular sheet 131b being the same as a distance between the first annular sheet 131a and the third annular sheet 131c. By providing multiple annular sheets 131, the support strength of shell body 110 is increased, the structural strength of the heat dissipation device is increased, and the risk of compression deformation of the overall structure of the heat dissipation device is reduced.

It should be understood that the number of the annular sheets 131 may be one or more, and the number of the annular sheets 131 is not limited in the present application. The above arrangements in which one or three annular sheets 131 are provided are only as examples and this application does not intend to limit the specific amount of the annular sheet(s) 131.

Further, in order to facilitate the installation of the heat dissipating shell 100 on the underwater equipment, the shell body 110 may be in a structure of two semicircular cylinders, and the two semicircular cylinders are connected via hinges, such that the opening and closing of the shell body 110 can be controlled through the hinges to place the underwater equipment in the shell body 110 during usage. It should be understood that in order to facilitate installation, if the shell body 110 is in the structure of two semicircular cylinders, the annular sheet 131 may be formed of two semi-circular rings, such that the annular sheet 131 can be opened and closed with the opening and closing of the shell body 110, thereby reducing difficulty of installing the underwater equipment to the shell body 110.

As shown in FIG. 6, in the case that the fixing support 130 includes multiple annular sheets 131, the annular sheets 131 may block flowing of water within the heat dissipation chamber 120. Therefore, in some embodiments, the annular sheet 131 is provided with multiple water permeating holes 1311 arranged in an array, and the diameter of the water permeating hole 1311 is less than or equal to the diameter of the first water inlet 201. In this way, although the heat dissipation chamber 120 is divided into multiple chamber segments by these annular sheets 131, liquid can flow through the water permeation holes 1311, and thus the heat dissipation efficiency of the heat dissipation device for the underwater equipment is increased.

In some embodiments of the present application, in order to improve the installation stability of the heat dissipation device, a friction piece 1312 may be provided on the annular sheet 131, as shown in FIG. 6. In an exemplary implementation, the friction piece 1312 is provided between the cylindrical inner surface and the housing of the underwater equipment. The friction piece 1312 can increase the friction between the annular sheet 131 and the underwater equipment, thereby reducing sliding of the heat dissipation shell 100 relative to the underwater equipment and improving the structural stability of the heat dissipation shell 100 and the underwater equipment.

Further, in order to improve the support strength of the annular sheet 131 for the heat dissipation shell 100, as shown in FIG. 6, the shell body 110 is provided thereon with a fixing groove 140, and the annular sheet 131 is arranged in the fixing groove in an interference fit with the annular sheet 131 such that the fixing groove 140 can clamp the annular sheet 131, and thus arrange the annular sheet 131 between the housing of the underwater equipment and the shell body 110. Therefore, the annular sheet 131 can be fixed through the shell body 110 to increase the support strength of the annular sheet 131 for the heat dissipation chamber 120 and thus improve the structural strength of the heat dissipation device for the underwater equipment.

In some embodiments, the annular sheet 131 may be provided on the shell body 110 in the manner of welding, clamping, bonding, etc. The specific manner of disposing the annular sheet 131 is not limited in the present application.

Figure 7:
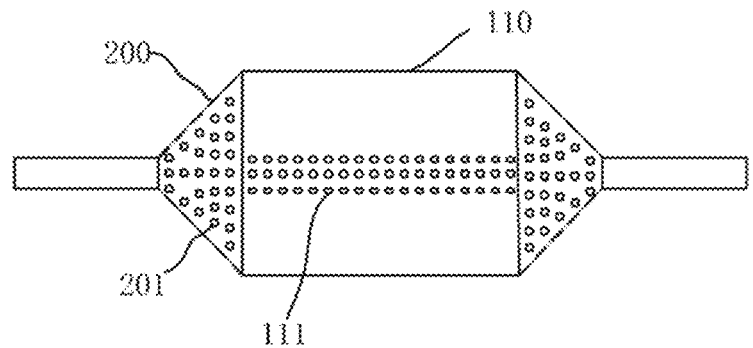
FIG. 7 is a structural schematic diagram of yet another heat dissipation device for an underwater equipment according to some embodiments of the present application.

In some embodiments of the present application, in order to increase the water filling rate of the heat dissipation shell 100 and avoid insufficient water filling in the heat dissipation chamber 120 during the burying process, as shown in FIG. 7, the heat dissipation shell 100 may be provided thereon with multiple second water inlets 111 in an array, and the aperture of the second water inlet 111 is less than or equal to the aperture of the first water inlet 201.

In an exemplary implementation, in order to reduce silt entry, the second water inlets 111 may be provided in opposite sides of the shell body 110, and when burying the heat dissipation shell 100, it is desirable to place the heat dissipation shell 100 in such a way that the second water inlets 111 are towards the opposite lateral directions relative to the underwater equipment, to avoid the silt from flowing into the heat dissipation shell due to silt extrusion in the upper and lower directions after the heat dissipation shell 100 is buried.

By adding the second water inlets 111 in the heat dissipation shell 100, the water filling rate of heat dissipation chamber 120 is increased, which avoids insufficient water filling in heat dissipation chamber 120.

Figure 8:
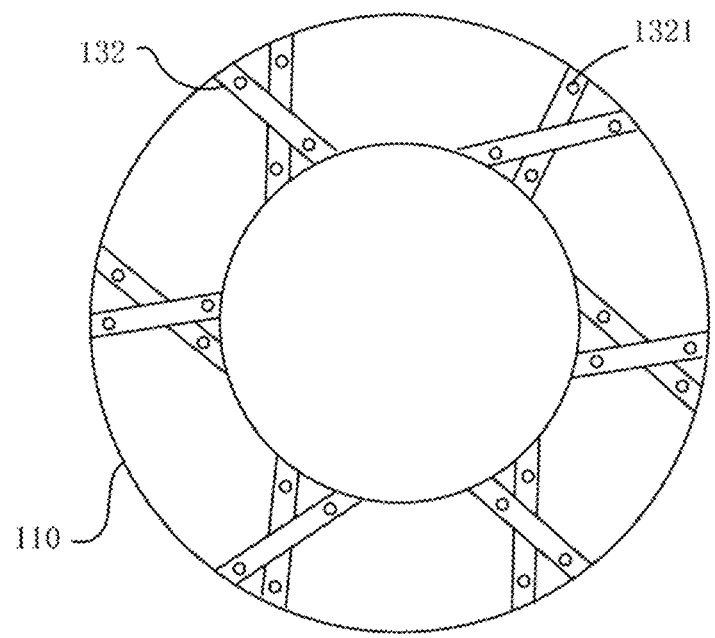
FIG. 8 is a cross section schematic diagram of yet another heat dissipation device for an underwater equipment according to some embodiments of the present application.

In some embodiments of the present application, as shown in FIG. 8, the fixing support 130 may include multiple support pillars 132 arranged in an array that forms one or more annular structures to provide support for the shell body 110. For example, the multiple support pillars 132 may form a spoke annular structure to provide support for the shell body 110. A pore exists between two adjacent support pillars 132 such that water can flow through the pore. In this way, the support function can be achieved through the multiple support pillars 132 and thus the risk of structural deformation is reduced.

In an exemplary implementation, the support pillars 132 may be provided with water permeating holes 1321 such that water can flow through the water permeating holes 1321. In some embodiments, if the fixing support 130 includes multiple support pillars 132, the shell body 110 may be provided with fixing grooves 140 having a shape matching with one end of each support pillar 132, so as to cooperate with the end of the support pillar, and thus place the support pillars 132 between the underwater equipment and the shell body 110.

It should be understood that the support pillars 132 may be provided on the shell body 110 in the manner of welding, clamping, bonding, etc. The specific manner of arranging the support pillars 132 is not limited in the present application.

In order to improve the structural strength, the fixing support 130 may be made of metal material. In some embodiments of the present application, the material of the fixing support 130 may be the same as the materials of the shell body 110 and the water permeating component 200.

From the above solutions, a heat dissipation device for an underwater equipment is provided, which is applied to the underwater equipment of an underwater communication system. The heat dissipation device includes a heat dissipation shell 100 and a water permeating component 200. The heat dissipation shell 100 is sleeved around an outside of the underwater equipment, and the heat dissipation shell 100 includes an shell body 110 in a cylindrical structure, with a diameter of a cross section of the shell body 110 being greater than a diameter of a cross section of a housing of the underwater equipment. The shell body 110 and the underwater equipment are coaxially arranged. The water permeating component 200 is in a conical structure and is provided with a plurality of first water inlets 201 arranged in an array, the water permeating component 200 is arranged at each of two ends of the heat dissipation shell 100 and is connected with the shell body 110 to enclose and form a heat dissipation chamber 120 together with the shell body 110 and the housing of the underwater equipment. Through the above structure, the heat generated by the underwater equipment can be dissipated through the liquid in the heat dissipation chamber 120 and the heat dissipation shell after the underwater equipment is buried, and thus the heat dissipation efficiency for the underwater equipment buried under the silt in the shallow water area can be improved.

The similar parts of the embodiments provided by the present application can be referred to with each other. The embodiments provided above are only some examples under the general idea of the present application and do not constitute limitation on the protection scope of the present application. For persons skilled in the art, any other implementations that are envisaged based on the present application without creative labor shall fall within the protection scope of the present application.

What is claimed is:

1. A heat dissipation device for an underwater equipment, applied to an underwater equipment of an underwater communication system, comprising:
   a heat dissipation shell arranged around an outside of the underwater equipment, the heat dissipation shell comprising an shell body in a cylindrical structure, with a diameter of a cross section of the shell body being greater than a diameter of a cross section of a housing of the underwater equipment, the shell body and the underwater equipment being coaxially arranged; and
   a water permeating component in a conical structure and provided with a plurality of first water inlets arranged in an array, the water permeating component being arranged at two ends of the heat dissipation shell and connected with the shell body such that a heat dissipation chamber is enclosed and formed by the water permeating component, the shell body and the housing of the underwater equipment.

2. The heat dissipation device for the underwater equipment according to claim 1, wherein the heat dissipation shell further comprises a fixing support, and the fixing support is arranged between the housing of the underwater equipment and the shell body and is configured to support the heat dissipation chamber.

3. The heat dissipation device for the underwater equipment according to claim 2, wherein the fixing support comprises at least one annular sheet, the annular sheet comprises a cylindrical inner surface and a cylindrical outer surface, and the annular sheet is coaxial with the shell body, with the cylindrical inner surface abutting against the housing of the underwater equipment and the cylindrical outer surface abutting against the shell body.

4. The heat dissipation device for the underwater equipment according to claim 3, wherein the fixing support comprises three annular sheets arranged in an array between the housing of the underwater equipment and the shell body.

5. The heat dissipation device for the underwater equipment according to claim 3, wherein the annular sheet is provided with a plurality of water permeating holes arranged in an array, and a diameter of the water permeating hole is less than or equal to an aperture of the first water inlet.

6. The heat dissipation device for the underwater equipment according to claim 3, wherein the annular sheet is provided thereon with a friction piece, the friction piece being arranged between the cylindrical inner surface and the housing of the underwater equipment and configured to increase friction between the annular sheet and the underwater equipment.

7. The heat dissipation device for the underwater equipment according to claim 3, wherein the shell body is provided with a fixing groove, and the fixing groove is in an interference fit with the annular sheet so as to arrange the annular sheet on the shell body.

8. The heat dissipation device for the underwater equipment according to claim 2, wherein the fixing support comprises a plurality of support pillars arranged in an array, and a pore is formed between two adjacent support pillars; one end of the support pillar is abutted on the shell body and the other end of the support pillar is in contact with the housing of the underwater equipment.

9. The heat dissipation device for the underwater equipment according to claim 1, wherein the heat dissipation shell and the water permeating component are made of metal.

10. The heat dissipation device for the underwater equipment according to claim 1, wherein the heat dissipation shell is provided with a plurality of second water inlets arranged in an array, and an aperture of the second water inlet is less than or equal to an aperture of the first water inlet.

11. The heat dissipation device for the underwater equipment according to claim 1, wherein an aperture of the first water inlet is less than 5 mm and greater than 1 mm.

* * * * *